United States Patent [19]

Shibata et al.

[11] Patent Number: 4,939,386
[45] Date of Patent: Jul. 3, 1990

[54] SEMICONDUCTOR INTEGRATED CIRCUIT DEVICE WITH MISFETS USING TWO DRAIN IMPURITIES

[75] Inventors: Ryuuji Shibata; Ken Uchida, both of Higashiyamato; Toshifumi Takeda; Youichi Matsumoto, both of Kodaira, all of Japan

[73] Assignee: Hitachi, Ltd., Tokyo, Japan

[21] Appl. No.: 118,537

[22] Filed: Nov. 4, 1987

[30] Foreign Application Priority Data

Nov. 12, 1986 [JP]  Japan .................. 61-267533

[51] Int. Cl.$^5$ ............. H03K 3/353; H01L 29/78; H01L 27/02; H01L 29/167
[52] U.S. Cl. ................... 307/304; 357/23.9; 357/41; 357/42; 357/63; 357/91
[58] Field of Search .............. 357/23.9, 41, 42, 63, 357/91; 307/304

[56] References Cited

U.S. PATENT DOCUMENTS

| | | | |
|---|---|---|---|
| 4,356,623 | 11/1982 | Hunter | 357/23.9 |
| 4,404,733 | 9/1983 | Sasaki | 357/23.9 |
| 4,672,419 | 6/1987 | McDavid | 357/23.9 |
| 4,736,233 | 4/1988 | McDavid | 357/23.9 |
| 4,745,086 | 5/1988 | Parillo et al. | 357/23.9 |
| 4,784,965 | 11/1988 | Woo et al. | 357/23.9 |

OTHER PUBLICATIONS

"Full LDD Devices Fabricated by Photoresist Planarization" IBM Tech. Disclosure Bulletin vol. 27, (3/85) pp. 5699-5700.
"Microdevices" Nikkei Electronics, Aug. 22, 1983, Nikkei McGraw-Hill, pp. 82-86.

Primary Examiner—Gene M. Munson
Attorney, Agent, or Firm—Antonelli, Terry, Stout & Kraus

[57] ABSTRACT

Disclosed in an N-type MISFET having the LDD structure in which the short-channel effect is reduced by employing arsenic, which has a smaller diffusion coefficient value than that of phosphorus, to form low- and high-impurity concentration regions which constitute in combination source and drain regions of the MISFET.

44 Claims, 6 Drawing Sheets

SEMICONDUCTOR INTEGRATED CIRCUIT DEVICE WITH MISFETS USING TWO DRAIN IMPURITIES

BACKGROUND OF THE INVENTION

The present invention relates to semiconductor integrated circuit devices and, more particularly, to a technique which may effectively be applied to semiconductor integrated circuit devices having MISFETs.

It is a known practice to adopt the LDD (Lightly Doped Drain) structure in order to relax the electric field at the drain end of N-channel MISFET. In the LDD structure, the low-concentration region of the drain on the side thereof which is closer to the channel region is formed using phosphorus, which has a relatively large diffusion coefficient.

Techniques concerning MISFETs having the LDD structure are described, for example, in "Microdevices", an extra issue of Nikkei Electronics, Aug. 22, 1983, Nikkei McGraw-Hill, p. 82–86.

SUMMARY OF THE INVENTION

We examined the above-described conventional technique and, as a result, have found that the prior art suffers from the following problem.

As the integration density increases, the gate length is reduced correspondingly. However, if the above-described low-concentration region of the drain is formed using phosphorus having a relatively large diffusion coefficient, the resulting low-concentration region undesirably extends into the channel region to a substantial extent, thus causing a short-channel effect.

It is an object of the present invention to improve the characteristics of a MISFET.

It is another object of the present invention to prevent the occurrence of a short-channel effect in a MISFET.

It is still another object of the present invention to prevent the occurrence of a short-channel effect which would otherwise be caused due to the fact that a low-concentration region of the source and/or drain region in a MISFET undesirably extends into the channel region.

The above and other objects and novel features of the present invention will become apparent from the following description taken in conjunction with the accompanying drawings.

One typical embodiment among those disclosed in this application will briefly be explained below.

Namely, according to the present invention, the low-concentration region of the drain on the side thereof which is closer to the channel region is formed using an impurity which has a smaller diffusion coefficient than that of phosphorus.

The above-described means enables minimization of the degree at which the low-concentration region extends into the channel region. Accordingly, it is possible to prevent the occurrence of a short-channel effect and hence improve the characteristics of the MISFET.

DESCRIPTION OF THE PREFERRED EMBODIMENT

The arrangement of the present invention will be described hereinunder by way of one embodiment and with reference to the accompanying drawings.

It should be noted that throughout the drawings members or portions having the same functions are denoted by the same reference numerals and repetitive description thereof is omitted.

Figure 1:
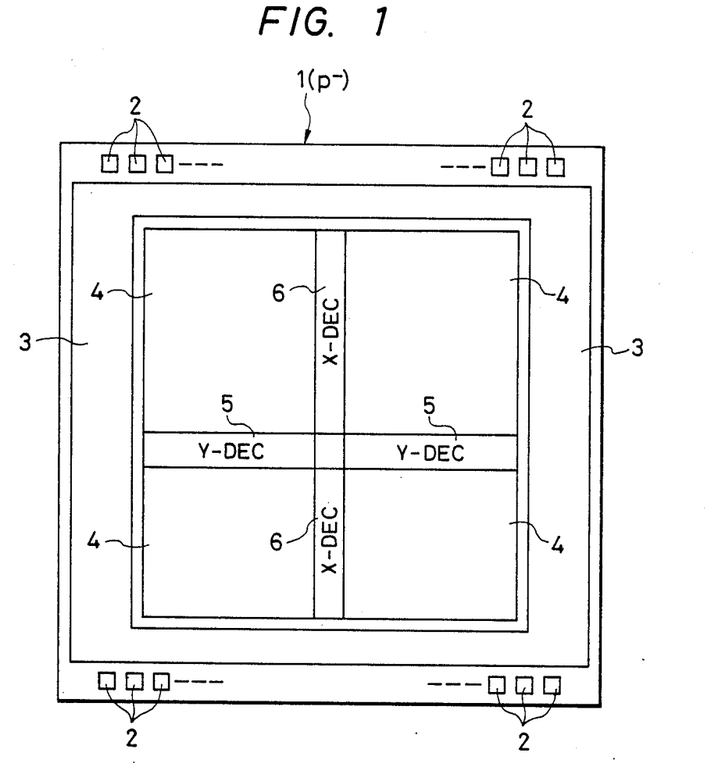
FIG. 1 is a plan view of a semiconductor chip having MISFETs.

FIG. 1 is a plan view of a so-called vertical ROM (Read Only Memory) having a memory cell array which consists of a plurality of cell rows each formed by arranging a plurality of N-channel MISFETs in series which define memory cells, respectively.

Referring to FIG. 1, the reference numeral 1 denotes a semiconductor substrate such as $p^-$-type single crystal silicon, and a plurality of bonding pads 2 are disposed around the substrate, the pads 2 being formed by, for example, stacking up first- and second-level aluminum films. The reference numeral 3 denotes peripheral circuit regions where an address buffer, a clock circuit, a main amplifier, an input-output buffer, an input protect circuit and the like are provided, the regions 3 being defined by, for example, N- and P-channel MISFETs. The numeral 4 denotes memory cell array regions each defined by a plurality of arrayed N-channel MISFETs. It should be noted that a practical arrangement of the memory cell array regions 4 will be described later in detail. The numeral 5 denotes Y-decoders which are formed using N- and P-channel MISFETs. The numeral 6 denotes X-decoders which are also formed using N- and P-channel MISFETs.

The area on the semiconductor substrate (chip) 1 which is occupied by the memory cell array regions 4 and the circuit regions 5, 6 accounts for about 70% of the entire area. Accordingly, it is essential in order to achieve high integration to minimize the size of the MISFETs which constitute the memory cell regions 4.

The arrangement of a part of the memory cell arrays will next be explained.

Figure 2:
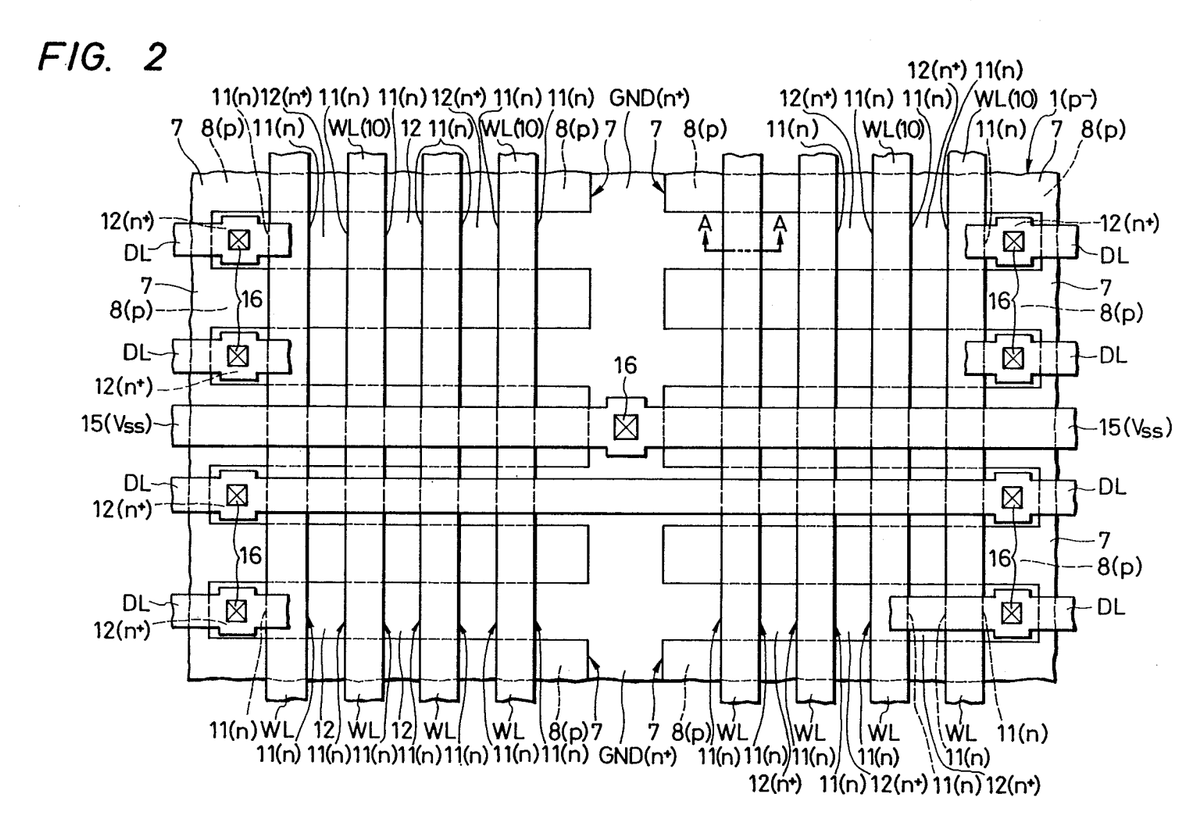
FIG. 2 is a plan view of a part of the memory array shown in FIG. 1.
Figures 3A, 3B:
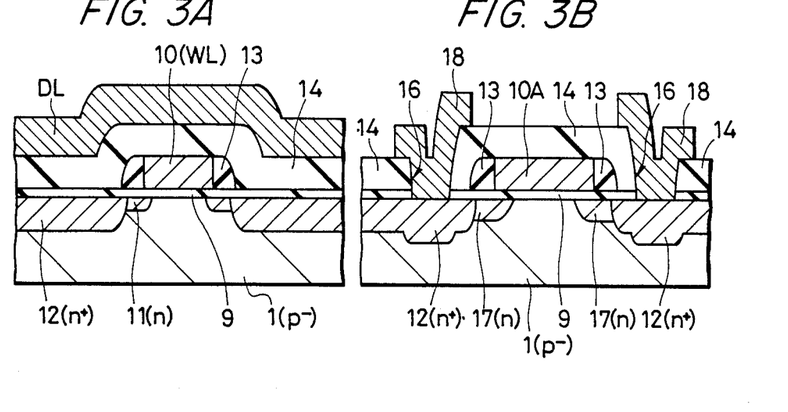
FIG. 3A is a sectional view taken along the line A—A of FIG. 2.
FIG. 3B is a sectional view of a MISFET which is employed to constitute a peripheral circuit region.

FIG. 2 is a plan view of a part of a memory cell array, and the region A in FIG. 3 is a sectional view taken along the line A—A of FIG. 2. The region B in FIG. 3 is a sectional view of an N-channel MISFET used to constitute the peripheral circuit regions 3. It should be noted that insulating films other than a field insulating film 7 are not shown in FIG. 2 for facilitating understanding of the arrangement of the memory cells.

In FIGS. 2 and 3A, the reference numeral 7 denotes a field insulating film which is defined by a silicon oxide film formed by selective oxidation of the surface of the semiconductor substrate 1. A p-type channel stopper region 8 is formed below the field insulating film 7. The field insulating film 7 and the p-type channel stopper region 8 are formed in such a manner that the pattern of the memory cells can be defined thereby. Each of the N-channel MISFETs respectively defining the memory cells is composed of a gate insulating film 9 defined by a silicon oxide film which is formed by thermal oxidation of that portion of the surface of the semiconductor substrate 1 which is exposed from the field insulating film 7, a gate electrode formed by stacking successively a polycrystalline silicon film formed by, for example, CVD, and a refractory metal film such as Mo, W, Ta, Ti or the like or a silicide film of such a refractory metal, n-type semiconductor regions (low-concentration regions) 11 which respectively define portions of source and drain regions on the sides thereof which are closer to the channel region, and n+-type semiconductor regions (high-concentration regions) 12 which define portions of the source and drain regions on the sides thereof which are remote from the channel region. It should be noted that in FIG. 2 lead wires which denote the n-type semiconductor regions 11 define the side surfaces of the corresponding gate electrodes 10 as a matter of convenience. A plurality of the above-described N-channel MISFETs are arranged in series in the direction in which data lines DL extend, thereby defining rows of cells. More specifically, the n+-type semiconductor region 12 which constitutes a portion of the source or drain region of one MISFET is formed integrally with the n+-type semiconductor region 12 which constitutes a part of the source or drain region of a MISFET which is disposed adjacent to said MISFET in the direction in which the data lines DL extend. The reference symbol GND denotes an n+-type semiconductor region which serves as a grounding line for the memory cells, the region GND being formed in the same step as that for the n+-type semiconductor regions 12. The semi-conductor region GND extends in the direction in which it intersects the data lines DL, the memory cells being arranged on both sides of the semiconductor region GND.

The n-type semiconductor regions 11 are formed using an n-type impurity, e.g., arsenic (As), which has a relatively small diffusion coefficient. The dose of arsenic is set at about $1 \times 10^{13}$ atoms/cm$^2$. Employment of arsenic enables minimization of the degree at which the n-type semiconductor regions 11 extend into the region under the corresponding gate electrode 10, thereby preventing the occurrence of a short-channel effect. The gate length of each gate electrode 10 is set at about 1.0 μm. The dimensions of the n-type semiconductor regions 11 are determined by side-walls 13 which are defined by silicon oxide films formed by, for example, CVD. The n+-type semi-conductor regions 12 are formed using an n-type impurity, e.g., arsenic, at a dose of about $5 \times 10^{15}$ atoms/cm$^2$. Employment of an n-type impurity having a relatively small diffusion coefficient, e.g., arsenic, enables minimization of the junction depth, thereby achieving a reduction in the junction capacitance. Each gate electrode 10 is formed integrally with the corresponding word line WL which is disposed on the field insulating film 7, the gate electrode 10 therefore extending in the direction in which it intersects the data lines DL. The word lines WL and the gate electrodes 10 are covered with an insulating film 14 which is formed by stacking successively a silicon oxide film formed by, for example, CVD, and a phosphosilicate glass (PSG) film. The data lines DL are defined by an aluminum film formed by, for example, sputtering, and are connected to the n+-type semi-conductor regions 12 serving as the drain regions of the MISFETs defining memory cells, said n+-type semi-conductor regions 12 being those of the regions 12 of the MISFETs which are located on the sides thereof which are remote from the semiconductor region GND, and the data lines DL being connected respectively to said drain regions 12 through contact holes 16 provided by selectively removing the gate insulating film 9 and the insulating film 14.

Among the P- and N-channel MISFETs constituting the various circuits in the peripheral circuit regions 3, the arrangement of the N-channel MISFETs will next be explained.

The region B in FIG. 3 shows the cross-sectional structure of one of the above-described N-channel MISFETs.

In FIG. 3B, the reference numeral 17 denotes n-type semiconductor regions (low-concentration regions) which define regions of the source and drain regions of the MISFET on the sides thereof which are closer to the channel region. The n-type semiconductor regions 17 are formed using an n-type impurity, e.g., phosphorus (P), having a relatively large diffusion coefficient with a view to relaxing the electric field at the drain end as much as possible. Accordingly, the degree at which the regions 17 extend into the region under the gate electrode 10A is greater than that in the case of the n-type semiconductor regions 11 of the above-described memory cells. The dimensions of the n-type semiconductor regions 17 are determined by side-walls 13. The n+-type semiconductor regions 12 are formed using an n-type impurity, e.g., arsenic, having a relatively small diffusion coefficient in the same way as in the case of the memory cells.

The gate electrode 10A is defined by the same layer as that for the gate electrodes 10 and the word lines WL for the memory cells including, for example, a combination of a polycrystalline silicon film and a refractory metal film or a silicide film of a refractory metal. However, the gate length of the gate electrode 10A is set at about 1.2 μm. The reference numeral 18 denotes wirings which are defined by an aluminum film formed by, for example, sputtering, the wirings 18 being respectively connected through contact holes 16 to the n+-type semiconductor regions 12 which respectively constitute the other portions of the source and drain regions.

Figure 4:
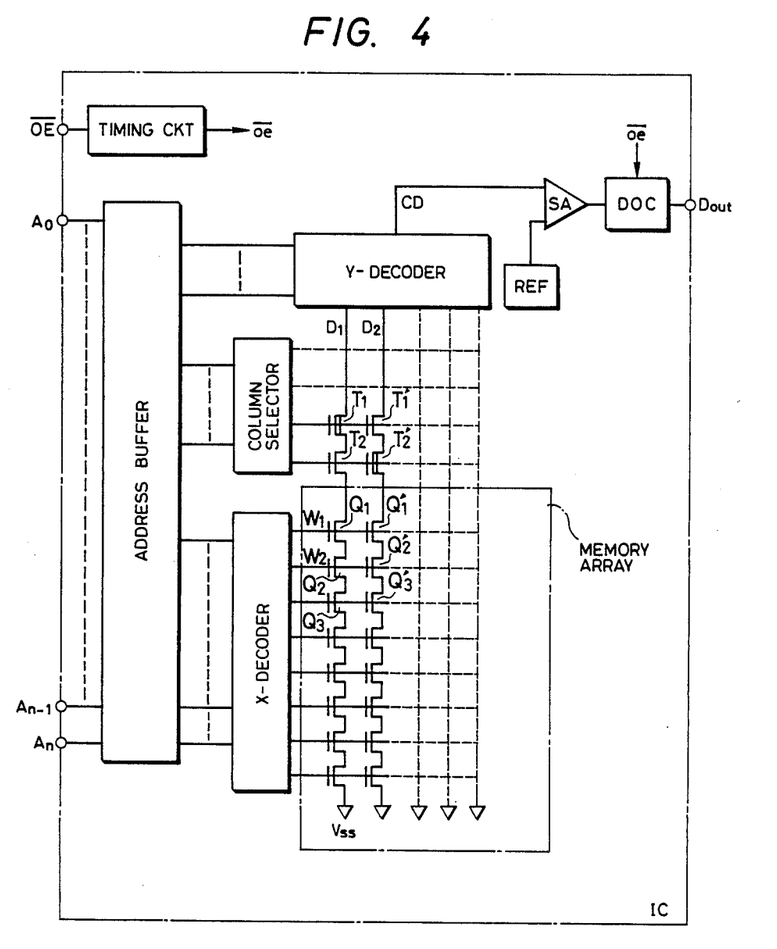
FIG. 4 is a circuit diagram showing the circuit configuration of a vertical ROM arranged in accordance with one embodiment of the present invention.

FIG. 4 shows the circuit configuration of a mask-programmed ROM arranged in accordance with one embodiment of the present invention. The basic arrangement of this circuit is the same as the circuit shown in FIG. 1. As shown in FIG. 4, the mask-programmed ROM is provided with a row address decoder X-DECODER, a column selector, and a column address decoder Y-DECODER. A multiplicity of word lines $W_1$, $W_2$ are connected to the row address decoder X-DECODER. The row address decoder X-DECODER is arranged so that one of the word lines $W_1$, $W_2$ is selected on the basis of address signals $A_0$ to $A_n$. The column selector is connected to the gates of MISFETs $T_1$, $T_2$ which are respectively provided on a multiplicity of data lines $D_1$, $D_2$. Among the MISFETs $T_1$, $T_2$, any one set of MISFETs are turned ON on the basis of the address signals, thereby selecting one of the data lines $D_1$, $D_2$, and the selected data line is coupled to a common data line DC. It should be noted that one end of each of these data lines $D_1$, $D_2$ is set at the ground potential $V_{ss}$. MISFETs $Q_1$, $Q_2$, $Q_3$ which define memory cells are provided at the intersections between the word lines $W_1$, $W_2$ and the data lines $D_1$, $D_2$, respectively. The memory cells defined by the MISFETs constitute in combination a memory array. In this memory cell, a plurality of MISFETs are connected in series to each data lines, the MISFETs having different word lines coupled to their respective gates. Thus, a row of the MISFETs is disposed with respect to each data line.

Figure 5:
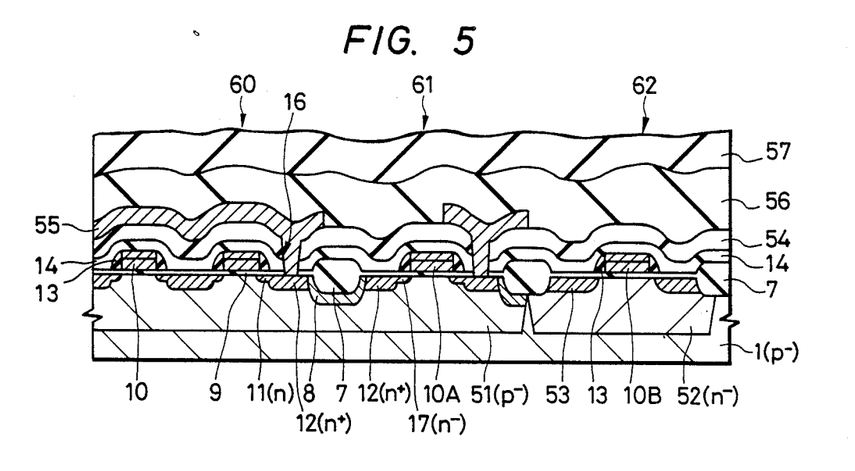
FIG. 5 is a sectional view of MISFETs which are employed to constitute the memory cell array and peripheral circuit region, respectively, of the vertical ROM shown in FIG. 3.

By the operations of the row address decoder and the column selector, a memory cell from which information is to be read out is selected, and a signal corresponding the readout information is output through the common data line CD FIG. 5 shows one embodiment in which the present invention is applied to a mask-programmed ROM. The reference numeral 60 shown in FIG. 5 denotes a crossectional structure of an N-channel MISFET employed to constitute the memory cell array shown in FIG. 4, and the numerals 61 and 62 in FIG. 5 respectively denote the cross-sectional structures of N- and P-channel MISFETs employed to constitute the peripheral circuits shown in FIG. 4, for example, the address buffer, the row address decoder and the like.

One example of the process for producing the mask-programmed ROM shown in FIG. 5 will next be described with reference to FIGS. 6A to 6E.

Figure 6A:
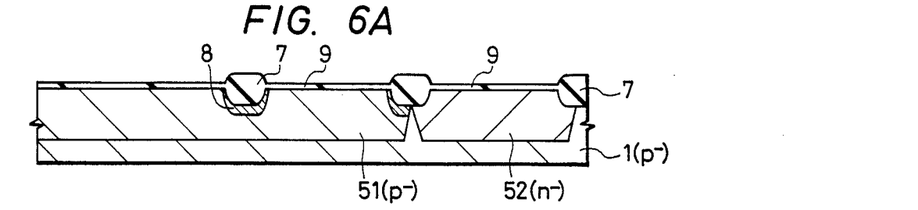
FIGS. 6A to 6E are sectional views respectively showing steps in the process for producing the semiconductor integrated circuit device shown in FIG. 3.

Referring first to FIG. 6A, an $N^-$-type well and a $P^-$-type well are formed in a P-type silicon substrate 1 by respective ion implantation processes. Further, a field insulating film 7 which is defined by $SiO_2$ is formed by local thermal oxidation of the main surface of the substrate 1. Thereafter, regions (active regions) of the surface of the substrate 1 where no field insulating film 7 is present are subjected to thermal oxidation to form gate insulating films 9. A P-type channel stopper region 8 is formed within the $P^-$-type well region and under the field insulating film 7 by ion implantation of, for example, boron ions, prior to the thermal oxidation carried out to form the field insulating film 7.

Then, the whole surfaces of the active regions of the semiconductor substrate 1 are subjected to channel doping by ion implantation of arsenic (As) through the gate insulating films 9, thereby writing the information "1" into the whole memory cells in the memory array. It should be noted that the energy and dose employed in this ion implantation are set at about 100 keV and about $2.4 \times 10^{12}$ cm$^{-2}$, respectively.

Figure 6B:
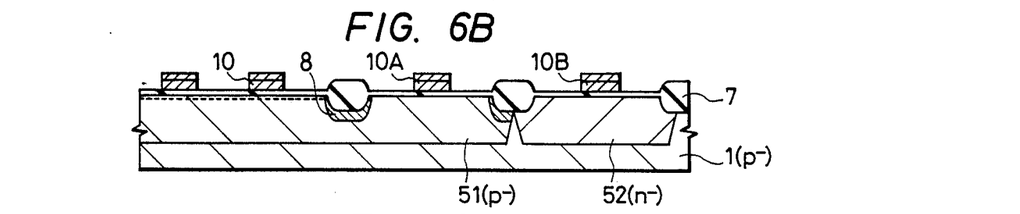
Figure 6C:
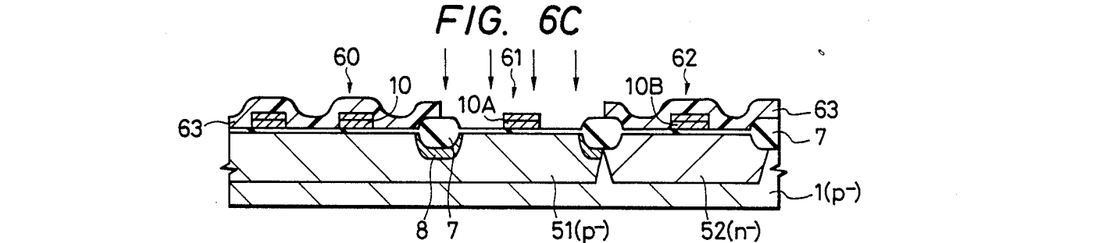

Then, the polycrystalline silicon formed on the whole surface of the substrate 1 by CVD and molibdenum silicide stacked thereon are selectively etched. As a result, gate electrodes 10, 10A and 10B are formed as shown in FIG. 6B. The gate length of the gate electrode 10 is set at about 1.0 μm, and that of the gate electrodes 10A and 10B is set at about 1.2 μm. Thereafter, the N-type well region 62 and the memory cell region 60 are masked with a photoresist film 63 as shown in FIG. 6C. In this state, phosphorus, which is an N-type impurity, is ion-implanted at a dose of about $1.0 \times 10^{13}$ cm$^{-2}$ with the gate electrode 10A used as a mask, thereby forming semiconductor regions 17 of low impurity concentration for an N-channel MISFET 61 which is employed to constitute a peripheral circuit.

Figure 6D:
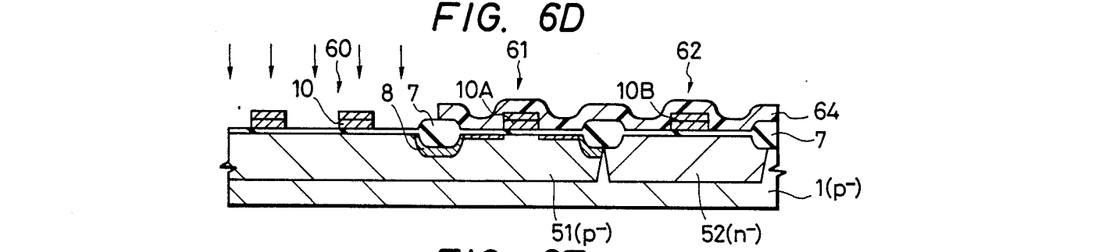

Then, the photoresist film 63 is removed, and the peripheral circuit regions 61 and 62 are masked with a photoresist film 64 as shown in FIG. 6D. In this state, As, which is an N-type impurity, is ion-implanted at a dose of about $1 \times 10^{13}$ cm$^{-2}$ with the gate electrode 10 used as a mask, thereby forming semiconductor regions 11 of low impurity concentration of the N-channel MISFET 60 for constituting a memory cell. In order to achieve a reduction in the area of the memory cell array, the gate length of the gate electrode 10 in the memory cell region 60 is set so as to be about 0.2 μm shorter than that of the gate electrodes 10A and 10B in the peripheral circuit regions. For this reason, a short-channel effect is readily caused by the n-type impurity which is undesirably diffused into the region under the gate electrode 10. Therefore, the degree at which the impurity is undesirably diffused into the area under the gate electrode 10 is minimized by the employment of arsenic which has a smaller diffusion coefficient than that of phosphorus. More specifically, the distance through which each semiconductor region 11 overlaps the gate electrode 10 is made shorter than the distance through which each semiconductor region 17 overlaps the gate electrode 10A or 10B in the peripheral region 61 or 62.

Figure 6E:
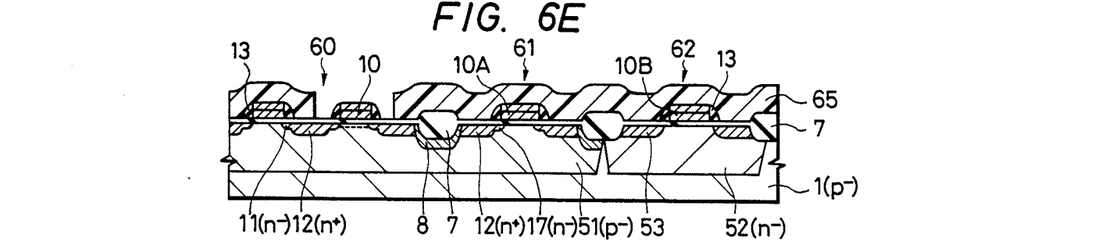

Then, the photoresist film 64 is removed, and a $SiO_2$ film is formed on the whole surface of the substrate 1 by CVD and is then subjected to anisotropic etching by the RIE (Reactive Ion Etching) method, thereby forming side-walls 13 at both sides, respectively, of each of the gate electrodes 10, 10A and 10B as shown in FIG. 6E. Then, the N-type well region 52 is masked with a photoresist film. In this state, arsenic, which is an N-type impurity, is ion-implanted with the gate electrodes 10, 10A and the side-walls 13 as masks, thereby forming semiconductor regions 12. It should be noted that the energy and dose employed in this ion implantation are set at about 80 keV and about $5.0 \times 10^{15}$ cm$^{-2}$, respectively, by way of example. As a result, two pairs of source and drain regions each having the LDD structure are respectively defined by a combination of the low-impurity concentration layer 11 and the high-impurity concentration layer 12 and a combination of the low-impurity concentration layer 17 and the high-impurity concentration layer 12. In other words, N-channel MISFETs each having the LDD structure are formed on the P-type well 51.

Then, the completed N-channel MISFETs are masked with a photoresist film. In this state, a P-type impurity, for example, boron, is ion-implanted with the gate electrode 10B and the side-walls 13 used as masks, thereby forming semiconductor regions 53. It should be noted that the dose in this ion implantation is set at about $3.0 \times 10^{15}$ cm$^{-2}$. The diffusion is carried out until the inner end of each semiconductor region 53 reaches the middle of the corresponding side-wall 13.

Then, a photoresist film 65 which is opened at a portion corresponding to a MISFET $Q_1$ which defines a memory cell into which, for example, the information "1" is to be written is formed on the substrate 1. Thereafter, with the photoresist film 65 used as a mask, a P-type impurity, e.g., boron, which has a smaller mass than that of phosphorus is ion-implanted through the gate electrode 10, the gate insulating film 9 and the like with an energy of 180 keV and at a dose of $1.6 \times 10^{13}$ cm$^2$, thereby subjecting the channel region of the MISFET $Q_1$ to channel doping.

Then, intermediate insulating films such as an HLD film 14 and a PSG film 54 are formed. Predetermined portions of the intermediate insulating films 14 and 54 are removed by etching to form predetermined contact holes. Then, an aluminum film is deposited and patterned. Thereafter, a final passivation film is formed on the substrate 1.

Thus, the process of producing the mask-programmed ROM according to one embodiment of the present invention is completed.

Figure 7:
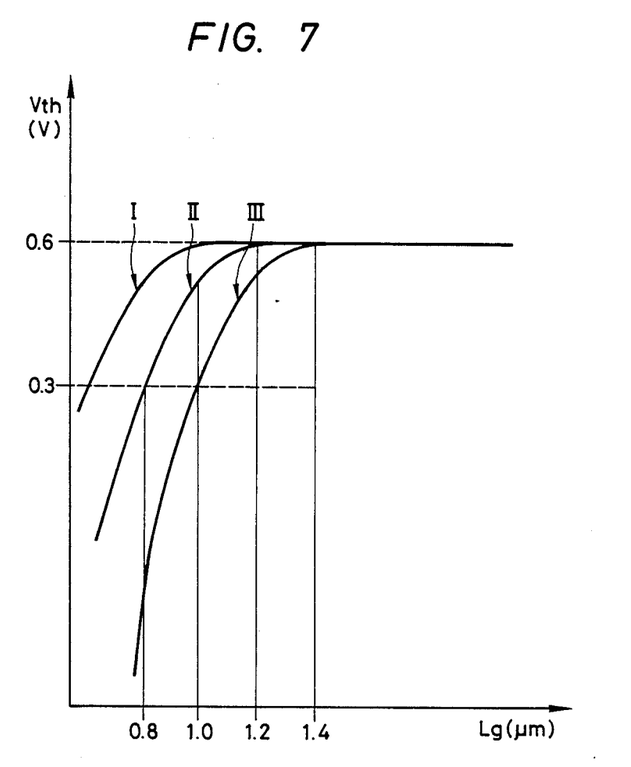
FIG. 7 is a chart showing the Lg-Vth characteristics of MISFETs.

FIG. 7 shows the threshold characteristics of the N-channel MISFET employed to constitute a memory cell and the N-channel MISFET employed to constitute the peripheral circuit regions.

In FIG. 7, the gate length Lg is plotted along the axis of abscissa, and the threshold value Vth is plotted along the axis of ordinate.

The curve I shows the threshold characteristics in the case where the source and drain regions are composed of a high-concentration region alone using arsenic as an impurity, that is, in the case where the singledrain structure is adopted. The curve II shows the threshold characteristics in the case where the source and drain regions are composed of low- and high-concentration regions using arsenic. The curve III shows the threshold characteristics in the case where the low-concentration region is formed using phosphorus and the high-concentration region is formed using arsenic.

The threshold value for enhancement-type N-channel MISFETs is generally set at 0.3 to 0.6 V. The threshold value of single-drain type MISFETs is predetermined within the range from 0.3 to 0.6 V when the gate length is about 0.8 µm. However, single-drain MISFETs are not practical for use because of the generation of many hot carriers. As shown by the curve II, if both the low- and high-concentration regions are formed using arsenic, the threshold value can be predetermined at 0.3 to 0.6 V when the gate length is within the range from about 0.8 to 1.0 µm. This technique is employed for the memory cells in accordance with this embodiment. As shown by the curve III, if the low- and high-concentration regions are formed using phosphorus and arsenic, respectively, the threshold value can be predetermined at 0.3 to 0.6 V when the gate length is within the range from about 1.0 to 1.2 µm. This technique is employed for the N-channel MISFETs for constituting the peripheral circuit regions 3 in accordance with this embodiment.

It should be noted that each MISFET which defines a memory cell is activated by applying a potential of high level (H), e.g., 2 V, to the semiconductor regions 11, 12 which constitute in combination the drain region of the MISFET and to the gate electrode 10 thereof. In other words, the gate length Lg and the source and drain regions 11, 12 are arranged so that the MISFETs respectively defining memory cells may be activated at 2 V. On the other hand, each MISFET which is employed to constitute the peripheral circuit regions 3 is activated by applying a voltage of, for example, 5 V, to the gate electrode 10A and to the semiconductor regions 17, 12 which constitute in combination the drain region of the MISFET. In other words, the gate length and the source and drain regions 17, 12 are arranged so that the MISFETs constituting the peripheral circuit regions 3 may be activated at 5 V. This is done in order to match the circuit operation with that of another semiconductor integrated circuit device (IC).

As has been described above, it is possible according to this embodiment to obtain the following advantageous effects.

In each MISFET which defines a memory cell, the low-concentration regions of the source and drain regions are formed using arsenic, which has a relatively small diffusion coefficient, and this enables minimization of the degree at which the low-concentration regions extend into the channel region. Accordingly, it is possible to reduce the gate length and hence achieve high integration.

Since the low-concentration regions of the source and drain regions of each MISFET which is employed to constitute the peripheral circuit regions 3 are formed using phosphorus, which has a relatively large diffusion coefficient, it is possible to effectively relax the electric field at the drain end portion. Thus, it is possible to effectively suppress the generation of hot carriers.

Although the present invention has been described above specifically by way of one embodiment, it should be noted here that the present invention is not necessarily limitative to the described embodiment and various changes and modifications may, of course, be imparted thereto without departing from the spirit and scope of the invention.

For example, the present invention may also be applied to the N-channel MISFETs constituting the peripheral circuit regions in the mask-programmed ROM in accordance with the embodiment of the present invention by clamping the voltage applied to activate the MISFETs constituting the peripheral circuit regions to thereby lower the applied voltage.

Further, the present invention may be applied to various kinds of semiconductor integrated circuit device, for example, logic ICs, microcomputers and the like.

What is claimed is:

1. A semiconductor integrated circuit device, comprising:

a semiconductor substrate of a first conductivity type having a main surface;

a first field effect transistor (FET) which is formed on said main surface, said first FET having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a first semiconductor region of a second conductivity type and a second semiconductor region, of said second conductivity type, which has a higher impurity concentration than that of said first semiconductor region, said first semiconductor region being disposed between said second semiconductor region and the portion of said semiconductor substrate in which the channel of said first FET is formed, wherein a first power potential is applied to said drain region of said first FET; and a second field effect transistor (FET) which is formed on said main surface, said second FET having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a third semiconductor region of said second conductivity type and a fourth semiconductor region, of said second conductivity type, which has a higher impurity concentration than that of said third semiconductor region, said third semiconductor region being disposed between said fourth semiconductor region and the portion of said semiconductor substrate in which the channel of said second FET is formed, wherein a second power potential which is higher in magnitude than said first power potential is applied to said drain region of said second FET, and wherein the value of the diffusion coefficient of an impurity element which is employed to form said first semiconductor region is smaller than that of an impurity element employed to form said third semiconductor region.

2. A semiconductor integrated circuit device according to claim 3, wherein the impurity employed to form said first, semiconductor, region is arsenic, and the impurity employed to form said third semiconductor region is phosphorus.

3. A semiconductor integrated circuit device according to claim 2, wherein the impurity employed to form said second and fourth semiconductor regions is arsenic.

4. A semiconductor integrated circuit device according to claim 3, wherein said first and second FETs comprise first and second metal insulator semiconductor field effect transistors (MISFETs), and wherein the gate electrode of said first MISFET has a length which is shorter than that of the gate electrode of said second MISFET.

5. A semiconductor integrated circuit device according to claim 3, which is a memory and wherein said first FET is employed to constitute a memory cell, and said second FET is employed to constitute a peripheral circuit.

6. A semiconductor integrated circuit device according to claim 5, wherein said memory is a read-only memory.

7. A semiconductor integrated circuit device according to claim 1, further comprising:
side-walls formed at both sides, respectively, of each of said gate electrodes by a silicon oxide film which is formed by chemical vapor deposition.

8. A semiconductor integrated circuit device according to claim 7, wherein said first and third semiconductor regions of said first and second FETs are formed by using the corresponding gate electrodes as masks for introduction of an impurity, and said second and fourth semiconductor regions of said first and second FETs are formed by using the corresponding gate electrodes and said side-walls as masks for introduction of an impurity.

9. A semiconductor integrated circuit device according to claim 1, wherein said first, second, third and fourth semiconductor regions are formed so as to have respective depths extending into said semiconductor substrate from said main surface thereof such that the depth of said second semiconductor region is greater than that of said first semiconductor region, and the depth of said fourth semiconductor region is greater than that of said third semiconductor region.

10. A semiconductor integrated circuit device according to claim 1, wherein said second power potential is substantially 5 volts.

11. A semiconductor integrated circuit device according to claim 10, wherein said first power potential is less than 2 volts.

12. A semiconductor integrated circuit device having a semiconductor substrate, a memory cell formed on said semiconductor substrate, and a peripheral circuit formed on said semiconductor substrate, said semiconductor integrated circuit device comprising:
a first field effect transistor (FET) constituting said memory cell, said first FET having a gate electrode formed on said semiconductor substrate through an insulating film, source and drain regions formed at portions of said semiconductor substrate which correspond to both sides, respectively, of said gate electrode and a corresponding channel forming portion disposed between said source and drain regions thereof, at least said drain region thereof having a first semiconductor region and a second semiconductor region which has a higher impurity concentration than that of said first semiconductor region, said first semiconductor region being disposed between said second semiconductor region and the portion of said semiconductor substrate in which the channel of said first FET is formed; and
a second field effect transistor (FET) constituting said peripheral circuit, said second FET having a gate electrode formed on said semiconductor substrate through an insulating film, source and drain regions formed at portions of said semiconductor substrate which correspond to both sides, respectively, of said gate electrode, and a corresponding channel forming portion disposed between said source and drain regions thereof, at least said drain region thereof having a third semiconductor region and a fourth semiconductor region which has a higher impurity concentration than that of said third semiconductor region, said third semiconductor region being disposed between said fourth semiconductor region and the portion of said semiconductor substrate in which the channel of said second FET is formed,
wherein the conductivity type of said first semiconductor region is the same as that of said third semiconductor region, and wherein the value of the diffusion coefficient of an impurity element which is introduced into said semiconductor substrate in order to form the first semiconductor region of said first FET is smaller than that of an impurity element introduced into said semiconductor substrate in order to form the third semiconductor region of said second FET.

13. A semiconductor integrated circuit device according to claim 12, wherein said first and second FETs comprise first and second metal insulator semiconductor field effect transistors, and wherein the gate electrode of said first MISFET has a length which is shorter than that of the gate electrode of said second MISFET.

14. A semiconductor integrated circuit device according to claim 12, wherein the impurity employed to form said first, semiconductor region is arsenic, and the impurity employed to form said third semiconductor region is phosphorus.

15. A semiconductor integrated circuit device according to claim 14, wherein the impurity employed to form said second and fourth semiconductor regions is arsenic.

16. A semiconductor integrated circuit device according to claim 15, wherein each of said first and second FETs comprises an n-channel metal insulator semiconductor field effect transistor (n-channel MISFET).

17. A semiconductor integrated circuit device according to claim 16, wherein the gate electrode of said first MISFET has a length which is shorter than that of the gate electrode of said second MISFET.

18. A semiconductor integrated circuit device according to claim 12, which is a read-only memory.

19. A semiconductor integrated circuit device according to claim 12, further comprising:
side-walls formed at both sides, respectively, of each of said gate electrodes by a silicon oxide film which is formed by chemical vapor deposition.

20. A semiconductor integrated circuit device according to claim 19, wherein said first and third semiconductor regions of said first and second FETs are formed by using the corresponding gate electrodes as masks for introduction of an impurity, and said second and fourth semiconductor regions of said first and second FETs are formed by using the corresponding gate electrodes and said side-walls as masks for introduction of an impurity.

21. A semiconductor integrated circuit device according to claim 20, wherein the impurity employed to form said second and fourth semiconductor regions is arsenic.

22. A semiconductor integrated circuit device according to claim 21, wherein said first and second FETs comprise first and second metal insulator semiconductor field effect transistors (MISFETs), and wherein the gate electrode of said first MISFET has a length which is shorter than that of the gate electrode of said second MISFET.

23. A semiconductor integrated circuit device according to claim 20, wherein said first, second, third and fourth semiconductor regions are formed so as to have respective depths extending into said semiconductor substrate from said main surface thereof such that the depth of said second semiconductor region is greater than that of said first semiconductor region, and the depth of said fourth semiconductor region is greater than that of said third semiconductor region.

24. A semiconductor integrated circuit device according to claim 23, wherein the impurity employed to form said second and fourth semiconductor regions is arsenic.

25. A semiconductor integrated circuit device according to claim 12, wherein said first, second, third and fourth semiconductor regions are formed so as to have respective depths extending into said semiconductor substrate from said main surface thereof such that the depth of said second semiconductor region is greater than that of said first semiconductor region, and the depth of said fourth semiconductor region is greater than that of said third semiconductor region.

26. A semiconductor integrated circuit device according to claim 12, wherein a first power potential is supplied to the drain region of said first FET, and a second power potential which is higher in magnitude than said first power potential is applied to the drain region of said second FET.

27. A semiconductor integrated circuit device according to claim 26, wherein said second power potential is substantially 5 volts.

28. A semiconductor integrated circuit device according to claim 27, wherein said first power potential is less than 2 volts.

29. A semiconductor integrated circuit device according to claim 12, wherein said first and second FETs are n-type metal-oxide-semiconductor transistor devices.

30. A read only memory device having a semiconductor substrate of a first conductivity type and which semiconductor substrate has a main surface, a memory cell formed on said main surface of said semiconductor substrate, and a peripheral circuit formed at a different part of said semiconductor substrate on said main surface thereof, said read only memory device comprising:
a first field effect transistor (FET) constituting said memory cell, said first FET having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a first semiconductor region of a second conductivity type and a second semiconductor region, of said second conductivity type, which has a higher impurity concentration than that of said first semiconductor region, said first semiconductor region being disposed between said second semiconductor region and the portion of said semiconductor substrate in which the channel of said first FET is formed; and
a second field effect transistor (FET) for constituting said peripheral circuit, said second FET having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a third semiconductor region of said conductivity type and a fourth semiconductor region, of said second conductivity type, which has a higher impurity concentration than that of said third semiconductor region, said third semiconductor region being disposed between said fourth semiconductor region and the portion of said semiconductor substrate in which the channel of said second FET is formed,
wherein the value of the diffusion coefficient of an impurity element which is employed to form said first semiconductor region is smaller than that of an impurity element employed to form said third semiconductor region.

31. A semiconductor integrated circuit device according to claim 30, wherein the impurity employed to form said first semiconductor regions is arsenic, and the impurity employed to form said third semiconductor region is phosphorus.

32. A semiconductor integrated circuit device according to claim 31, wherein the impurity employed to form said second and fourth semiconductor regions is arsenic.

33. A semiconductor integrated circuit device according to claim 30, wherein said first and second FETs comprise first and second metal insulator semiconductor field effect transistors (MISFETs), and wherein the gate electrode of said first MISFET has a length which is shorter than that of the gate electrode of said second MISFET.

34. A semiconductor integrated circuit device according to claim 30, wherein a first power potential is supplied to the drain region of said first FET, and a second power potential which is higher in magnitude than said first power potential is applied to the drain region of said second FET.

35. A semiconductor integrated circuit device according to claim 34, wherein said second power potential is substantially 5 volts.

36. A semiconductor integrated circuit device according to claim 35, wherein said first power potential is less than 2 volts.

37. A semiconductor integrated circuit device having a peripheral circuit and a memory cell array, said memory cell array having cell rows each formed by arranging first field effect transistors (FETs) in series, said semiconductor integrated circuit device comprising:

a semiconductor substrate of a first conductivity type having a main surface;

wherein said first FETs are formed on said main surface, each one of said first FETs having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a first semiconductor region of a second conductivity type and a second semiconductor region, of said second conductivity type, which has a higher impurity concentration than that of said first semiconductor region, said first semiconductor region being disposed between said second semiconductor region and the portion of said semiconductor substrate in which the channel of said first FET is formed; and a second field effect transistor (FET), for constituting said peripheral circuit, which is formed on said main surface, said second FET having a gate electrode formed on said main surface through an insulating film, source and drain regions formed at portions of said semiconductor substrate which correspond to both sides, respectively, of said gate electrode, and a corresponding channel forming portion disposed between said source and drain regions thereof, at least said drain region thereof having a third semiconductor region of said second conductivity type and a fourth semiconductor region, of said second conductivity type, which has a higher impurity concentration than that of said third semiconductor region, said third semiconductor region being disposed between said fourth semiconductor region and the portion of said semiconductor substrate in which the channel of said second FET is formed, wherein the value of the diffusion coefficient of an impurity element which is employed to form said first semiconductor region associated with each of said first FETs is smaller than that of an impurity element employed to form said third semiconductor region.

38. A semiconductor integrated circuit device according to claim 37, wherein the impurity employed to form said first semiconductor regions is arsenic, and the impurity employed to form said third semiconductor region is phosphorus.

39. A semiconductor integrated circuit device according to claim 38, wherein the impurity employed to form said second and fourth semiconductor regions is arsenic.

40. A semiconductor integrated circuit device according to claim 37, wherein each of said first FETs and said second FET are comprised of first metal insulator semiconductor field effect transistors (MISFETs) and a second metal insulator semiconductor field effect transistor, respectively, and wherein the gate electrode of each one of said first MISFETs has a length which is shorter than that of the gate electrode of said second MISFET.

41. A semiconductor integrated circuit device according to claim 37, wherein a first power potential is supplied to a drain region of one of said series-arranged first FETs of each cell row; and a second power potential which is higher in magnitude than said first power potential is applied to a drain region of said second FET.

42. A semiconductor integrated circuit device according to claim 41, wherein said second power potential is substantially 5 volts.

43. A semiconductor integrated circuit device according to claim 42, wherein said first power potential is less than 2 volts.

44. A semiconductor integrated circuit device according to claim 41, wherein said first power potential is applied to the drain of that one of said first FETs disposed at one end of each cell row, and a reference ground potential is applied to the source of the first FET in each row located at the other end thereof, said one end of each row being coupled to one end of a corresponding data line which controllably provides said first power potential to the corresponding memory cell row.

* * * * *